(12) United States Patent
Cheng et al.

(10) Patent No.: US 11,600,968 B2
(45) Date of Patent: Mar. 7, 2023

(54) SINGLE-MODE MICRO-LASER BASED ON SINGLE WHISPERING GALLERY MODE OPTICAL MICROCAVITY AND PREPARATION METHOD THEREOF

(71) Applicant: East China Normal University, Shanghai (CN)

(72) Inventors: Ya Cheng, Shanghai (CN); Jintian Lin, Shanghai (CN); Zhiwei Fang, Shanghai (CN); Renhong Gao, Shanghai (CN); Jianglin Guan, Shanghai (CN); Min Wang, Shanghai (CN)

(73) Assignee: East China Normal University, Shanghai (CN)

( * ) Notice: Subject to any disclaimer, the term of this patent is extended or adjusted under 35 U.S.C. 154(b) by 57 days.

(21) Appl. No.: 17/397,992

(22) Filed: Aug. 10, 2021

(65) Prior Publication Data

US 2021/0367402 A1 Nov. 25, 2021

(30) Foreign Application Priority Data

May 13, 2021 (CN) .......................... 202110521827.7

(51) Int. Cl.
*H01S 3/08* (2023.01)
*H01S 5/10* (2021.01)
*H01S 5/026* (2006.01)
*H01S 5/065* (2006.01)
*H01S 5/02251* (2021.01)
(Continued)

(52) U.S. Cl.
CPC ............ *H01S 5/1075* (2013.01); *H01S 5/026* (2013.01); *H01S 5/02251* (2021.01); *H01S 5/0653* (2013.01); *H01S 5/0654* (2013.01); *H01S 5/1014* (2013.01); *H01S 5/1028* (2013.01);
(Continued)

(58) Field of Classification Search
CPC .... H01S 5/1075; H01S 5/02251; H01S 5/026; H01S 5/0653; H01S 5/0654; H01S 5/1014; H01S 5/1028; H01S 5/1042; H01S 5/041
See application file for complete search history.

(56) References Cited

U.S. PATENT DOCUMENTS 6,711,200 B1 * 3/2004 Scherer ................. G02B 6/122
372/39
2001/0033587 A1 * 10/2001 Painter ................. H01S 3/0627
372/6
(Continued)

*Primary Examiner* — Kinam Park

(57) ABSTRACT

A single-mode micro-laser based on a single whispering gallery mode optical microcavity and a preparation method thereof described includes: preparing a desired single whispering gallery mode optical microcavity doped with rare earth ions or containing a gain material such as quantum dots, wherein an optical microcavity configuration include a micro-disk cavity, a ring-shaped microcavity, and a racetrack-shaped microcavity; a material type include lithium niobate, silicon dioxide, silicon nitride, etc.; preparing an optical fiber cone or an optical waveguide of a required size which can excite high-order modes of the optical microcavity, such as a ridge waveguide and a circular waveguides; and coupling, integrating, and packaging the optical fiber cone or the optical waveguide with the microcavity. A pump light is coupled to the optical fiber cone or the optical waveguide to excite a compound mode with a polygonal configuration.

6 Claims, 3 Drawing Sheets

(51) Int. Cl.
 *G02B 6/25* (2006.01)
 *H01S 5/22* (2006.01)
 *H01S 5/04* (2006.01)

(52) U.S. Cl.
 CPC .............. *H01S 5/1042* (2013.01); *G02B 6/25* (2013.01); *H01S 5/041* (2013.01); *H01S 5/2206* (2013.01)

(56) References Cited

U.S. PATENT DOCUMENTS

| | | | | |
|---|---|---|---|---|
| 2004/0179573 | A1* | 9/2004 | Armani | G02B 6/12007 385/146 |
| 2011/0163421 | A1* | 7/2011 | Mi | G02B 6/12 257/E29.022 |
| 2011/0188525 | A1* | 8/2011 | Claudon | H01S 5/1075 438/39 |
| 2012/0320939 | A1* | 12/2012 | Baets | H01S 5/1032 372/45.01 |
| 2015/0092808 | A1* | 4/2015 | Li | H01S 3/176 438/31 |
| 2019/0346625 | A1* | 11/2019 | Cheng | G03F 7/2051 |
| 2021/0104861 | A1* | 4/2021 | Lacomb | H01S 3/0941 |

* cited by examiner

SINGLE-MODE MICRO-LASER BASED ON SINGLE WHISPERING GALLERY MODE OPTICAL MICROCAVITY AND PREPARATION METHOD THEREOF

CROSS REFERENCE OF RELATED APPLICATION

The present invention claims priority under 35 U.S.C. 119(a-d) to CN 202110521827.7, filed May 13, 2021.

BACKGROUND OF THE PRESENT INVENTION

Field of Invention

The present invention relates to preparation of a single-mode micro-lasers, and more particularly to a single-mode narrow-linewidth laser based on a single whispering gallery mode optical microcavity and a preparation method thereof, wherein dry etching is applied to film materials such as crystal, silicon dioxide, silicon, compound semiconductor materials and silicon nitride doped with a certain concentration of rare earth ions or organic macromolecules or containing quantum dots, and chemical polishing technology is also adopted, so as to obtain an active optical microcavity with a low loss and a high Q value. Finally, through coupling and integration of an optical fiber cone or an optical waveguide, the single-mode micro-laser with a narrow line width and a low threshold can be obtained.

Description of Related Arts

Integrated optical path is designed to miniaturize and integrate optical devices and optical paths on a substrate, so as to reduce the size, energy consumption, and time delay of the optical system, as well as improve performance of the optical system such as stability and processing speed. It is expected to break through the energy consumption and bandwidth bottlenecks faced by conventional optical information processing systems. Micro-lasers, especially single-mode micro-lasers with narrow linewidths, are one of the most important optical devices for constructing integrated optical paths, which have important applications in laser communication, precision measurement, and biosensing (L. He, et al., Nature Nanotechnol. Vol. 6, P 428-432, 2011). Conventionally, micro-lasers are usually prepared based on photonic crystal microcavities, Fabry-Perot microcavities and whispering gallery mode optical microcavities. Among them, the whispering gallery mode optical microcavity can realize confinement of the photons through continuous total internal reflection of light at the interface between the cavity material and the surrounding material with lower refractive index, which has a high quality factor and a small mode volume (DK Armani, et al., Nature Vol. 421, P 925-928, 2003). Therefore, the micro-laser based on the whispering gallery mode optical microcavity has the advantages of low threshold and narrow line width. For single-mode lasing, the size of the whispering gallery mode optical microcavity (hereinafter referred to as optical microcavity) is usually required to be in the sub-micron order to suppress the mode numbers, which inevitably increases the bending radiation loss of the microcavity, reduces the quality factor of the microcavity, and significantly increases the pump threshold and laser linewidth of the micro-laser.

Conventionally, in order to overcome the above defects, a commonly used effective method is to take advantage of the vernier effect of two coupled optical microcavities, so as to excite only the whispering gallery mode shared by the two microcavities, thereby obtaining single-mode lasing with low threshold and narrow linewidth (G. Griffel, IEEE Photon. Technol. Lett. Vol 12, P 1642-1644, 2000; L. Shang, et al., Opt. Lett. Vol. 33, P 1150-1152, 2008). However, the preparation process is complicated and such method is unsuitable for cost-effective preparation. Preparing a single-mode micro-laser with low threshold and narrow linewidth based on single optical microcavity has become an urgent need to improve the application level of optoelectronic integration technology.

SUMMARY OF THE PRESENT INVENTION

An object of the present invention is to provide to overcome challenges of conventional on-chip single-mode micro-laser preparation and provide a single-mode micro-laser based on a single whispering gallery mode optical microcavity. The single-mode micro-laser has a simple preparation process, a low threshold and a narrow line width.

Accordingly, in order to accomplish the above objects, the present invention provides:

a preparation method of a single-mode micro-laser based on a single whispering gallery mode optical microcavity, comprising steps of:

1: preparing an optical microcavity containing a gain material by dry etching, wherein the optical microcavity is the whispering gallery mode optical microcavity; a free spectral range of the optical microcavity is at least ½ of a spectral width of the gain material; the gain material is rare earth ions, quantum dots, or organic macromolecular luminescent materials; a cavity material of the optical microcavity is crystals, silicon dioxides, silicon, III-V compound semiconductor materials or silicon nitride films;

2: preparing an optical fiber cone:

stripping a polymer layer of a standard single-mode optical fiber; cleaning the optical fiber and heating with hydrogen-oxygen flame, meanwhile stretching both ends of the optical fiber with a translation stage, so that a heated portion of the optical fiber is thinned to obtain the required optical fiber cone, and a thinned position is called a waist;

3: performing a coupling test on the optical microcavity and the optical fiber cone, and coupling a pump light, whose pump power is greater than a pump threshold, into the optical fiber cone; wherein the pump threshold is determined by a Q factor and a mode volume of the optical microcavity and a gain coefficient of the gain material, which comprises specific steps of: attaching the waist of the optical fiber cone to an edge of the optical microcavity, and inputting the pump light into one end of the optical fiber cone; restricting a wavelength of the pump light within an absorption spectrum wide range of the gain material;

4: continuously scanning the wavelength of the pump light within the absorption spectrum wide range of the gain material and adjusting or controlling a lateral coupling position of the optical fiber cone and the optical microcavity; observing the optical microcavity in real time through charge coupled device microscopic imaging until a coherently combined mode with a polygonal configuration appears at a pump wavelength, wherein the coherently combined mode is formed by superposition of a fundamental spatial mode and high-order spatial modes; then obtaining a Q value of the optical microcavity when the polygonal configuration appears through a transmission spectrum with a weak pump power, wherein the Q factor of the fundamental spatial mode of the optical microcavity is at least 2 times lower than the Q value of a polygonal mode;

5: fixing the wavelength of the pump light and continuously adjusting the pump power of the pump light until the optical microcavity displays a coherently combined composite mode with a polygonal configuration within an absorption range of the gain material, wherein the coherently combined mode is formed by superposition of a fundamental longitudinal spatial mode and a high-order longitudinal spatial modes, and is identical to the polygonal configuration in the step 4, wherein at this time, the pump light resonates with the coherently combined mode within the absorption spectrum of the gain material, and a lasing light resonates with a coherently combined mode within a fluorescence spectrum of the gain material;

6: coupling the lasing light from an output end of the optical fiber cone, and testing a spectrum and a line width of the lasing light with a spectrum analyzer, wherein the output power of the micro-laser from the optical fiber cone increases linearly with the pump power; obtaining the pump threshold at an inflection point on a calculated growth curve; and 7: fixing, integrating and packaging the optical fiber cone and the optical microcavity to obtain the single-mode micro-laser based on the single whispering gallery mode optical microcavity.

Alternatively, a preparation method of a single-mode micro-laser based on a single whispering gallery mode optical microcavity is provided, comprising steps of:

1: preparing an optical microcavity containing a gain material by dry etching, wherein the optical microcavity is the whispering gallery mode optical microcavity; a free spectral range of the optical microcavity is at least ½ of a spectral width of the gain material; the gain material is rare earth ions, quantum dots, or organic macromolecular luminescent materials; a cavity material of the optical microcavity is crystals, silicon dioxides, silicon, III-V compound semiconductor materials or silicon nitride films;

2: preparing a required optical waveguide by photolithography assisted dry etching to simultaneously accommodate high-order mode transmission and excite a high-order mode of the optical microcavity within an absorption spectrum wide range and a gain spectrum wide range of the gain material;

3: performing a coupling test on the optical microcavity and the optical waveguide, and coupling a pump light, whose pump power is greater than a pump threshold, into the optical waveguide; wherein the pump threshold is determined by a Q factor and a mode volume of the optical microcavity and a gain coefficient of the gain material, which comprises specific steps of: attaching the optical waveguide to an edge of the optical microcavity, and inputting the pump light into one end of the optical waveguide; restricting a wavelength of the pump light within the absorption spectrum wide range of the gain material; continuously increasing the pump power of the pump light, wherein when the pump power of the pump light is greater than the pump threshold, the output power of the micro-laser from the optical waveguide increases linearly with the pump power; obtaining the pump threshold at an inflection point on a calculated growth curve;

4: continuously scanning the wavelength of the pump light within the absorption spectrum wide range of the gain material, and adjusting or controlling a spatial position of the optical waveguide and the optical microcavity to excite fundamental and high-order spatial modes within the microcavities; observing the optical microcavity in real time through charge coupled device microscopic imaging until a coherently combined mode with a polygonal configuration appears at pump wavelength, wherein the coherently combined mode is formed by superposition of a fundamental spatial mode and high-order spatial modes; then obtaining a Q value of the optical microcavity when the polygonal configuration appears through a transmission spectrum with weak pump power; and the Q factor of the fundamental spatial mode is at least 2 times lower than the Q factor of the coherently combined mode;

5: fixing the wavelength of the pump light and continuously adjusting the pump power of the pump light until the optical microcavity displays a coherently combined mode with a polygonal configuration within an absorption range of the gain material, wherein at this time, the pump light resonates with the coherently combined mode within the absorption spectrum of the gain material, and a lasing light resonates with a coherently combined mode within a fluorescence spectrum of the gain material;

6: coupling the lasing light from an output end of the optical waveguide, and testing a spectrum and a line width of the lasing light with a spectrum analyzer until a lasing with a single-mode, a narrow line width, and a low-threshold is obtained; where the output power of the micro-laser from the optical fiber cone increases linearly with the pump power; obtaining the pump threshold at an inflection point on a calculated growth curve; and 7: fixing, integrating and packaging the optical waveguide and the optical microcavity to obtain the single-mode micro-laser based on the single whispering gallery mode optical microcavity.

The single-mode micro-laser based on the single whispering gallery mode optical microcavity prepared by the above preparation methods comprises the single whispering gallery mode optical microcavity containing an active material, and the optical fiber cone or the optical waveguide, wherein the active material is rare earth ions, quantum dots, or organic macromolecular luminescent materials; the cavity material of the optical microcavity is crystals, silicon dioxides, silicon, III-V compound semiconductor materials or silicon nitride films; a line width of the single-mode microlaser is most 1 megahertz, and a threshold is at most 1 milliwatt.

The present invention utilizes the optical fiber cone or the optical waveguide that can support the high-order spatial mode transmission to couple with the optical microcavity. By adjusting the coupling position, the quality factor of the fundamental spatial mode of the optical microcavity is selectively reduced. At the same time, the polygonal coherently combined mode with the high quality factor in the optical microcavity, which is formed by the superposition of the fundamental spatial mode and the high-order spatial mode, is effectively excited. Furthermore, the pump light and the lasing light are resonant with the coherently combined modes, respectively, so as to obtain a single-mode lasing with the low threshold and the narrow line width.

Beneficial effects of the present invention are that: the single whispering gallery mode optical microcavity is used to prepare the single-mode micro-laser with the low threshold and the narrow line width, and to promote development of related high-tech industries. A platform material of the optical microcavity is doped with rare earth ions or organic macromolecules of a certain concentration, or films such as crystals containing quantum dots, silicon dioxide, silicon, III-V compound semiconductor materials and silicon nitride. By using the optical fiber cone with high transmittance and precisely controlled size (Y. Xu, et al., Opt. Express Vol. 25, P 10434-10440, 2017) or the optical waveguide which is easy to be integrated on chip, the polygonal configuration coherently combined mode formed by superposition of the fundamental spatial mode and the high-order spatial mode in the optical microcavity is excited, and a quality factor of an normal mode of the optical microcavity is reduced. Only one coherently combined mode can be excited in the free spectral range, and such mode is basically unaffected by coupling effect of the optical fiber cone or the optical waveguide. Therefore, the high quality factor is maintained. Under mode competition, only the coherently combined mode is cable of lasing, so the single-mode lasing with the low threshold and the narrow line width can be obtained.

DETAILED DESCRIPTION OF THE PREFERRED EMBODIMENT

The present invention will be further illustrated with the following embodiments and accompanying drawings, but the protection scope of the present invention should not be limited thereby.

Figure 1:
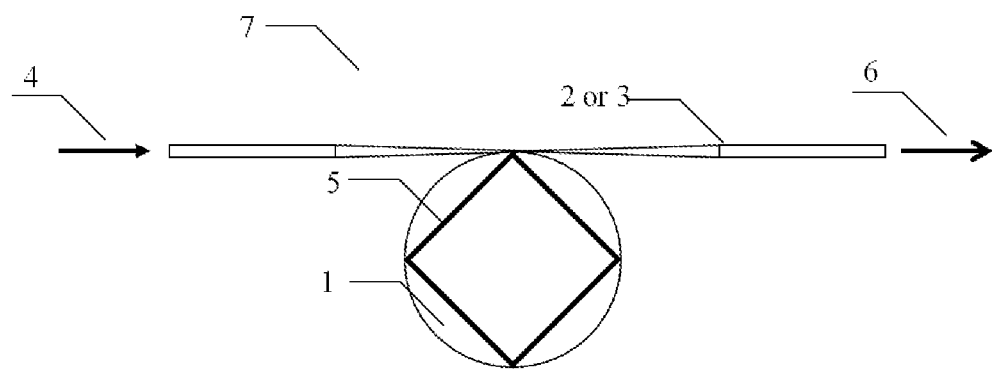
FIG. 1 is sketch view of a micro-laser of the present invention.
Figure 2:
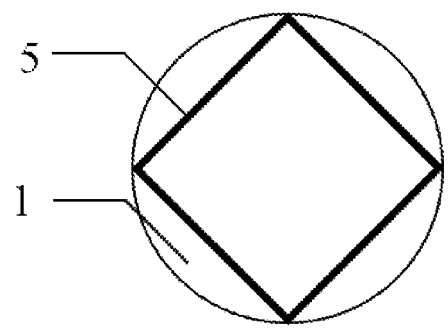
FIG. 2 illustrates a field distribution of a coherently combined mode of a microcavity of the present invention, which is formed by superposition of a fundamental spatial mode and a high-order spatial mode.

Referring to FIG. 1, a single-mode micro-laser is provided, which is formed by coupling and packaging an optical fiber cone or an optical waveguide and a single whispering gallery mode optical microcavity. As an example of the present invention, one optical fiber cone 2 or one optical waveguide 3 is coupled with an on-chip single whispering gallery mode optical microcavity 1, so as to realize single-mode lasing with a low threshold and a narrow line width based on a high-quality coherently combined mode 5 with a quadrilateral geometry. A platform material of the optical microcavity is doped with rare earth ions or organic macromolecules of a certain concentration, or films such as crystals containing quantum dots, silicon dioxide, silicon, III-V compound semiconductor materials and silicon nitride, wherein a lithium niobate film doped with 1 mol % erbium ions and a lithium niobate film containing quantum dots will be further described to illustrate the present invention, but the claims of the present invention should not be limited thereby.

Embodiment 1

Figure 3:
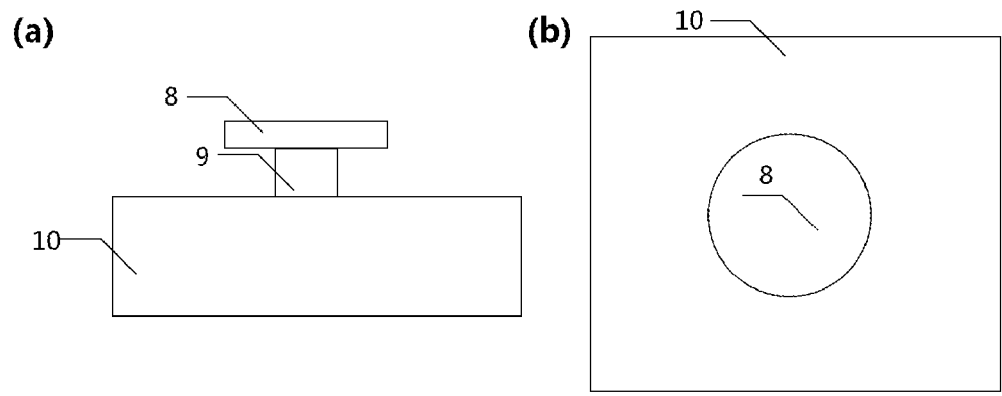
FIG. 3 is a structural view of an ion-doped optical microcavity of the present invention.
Figure 4:
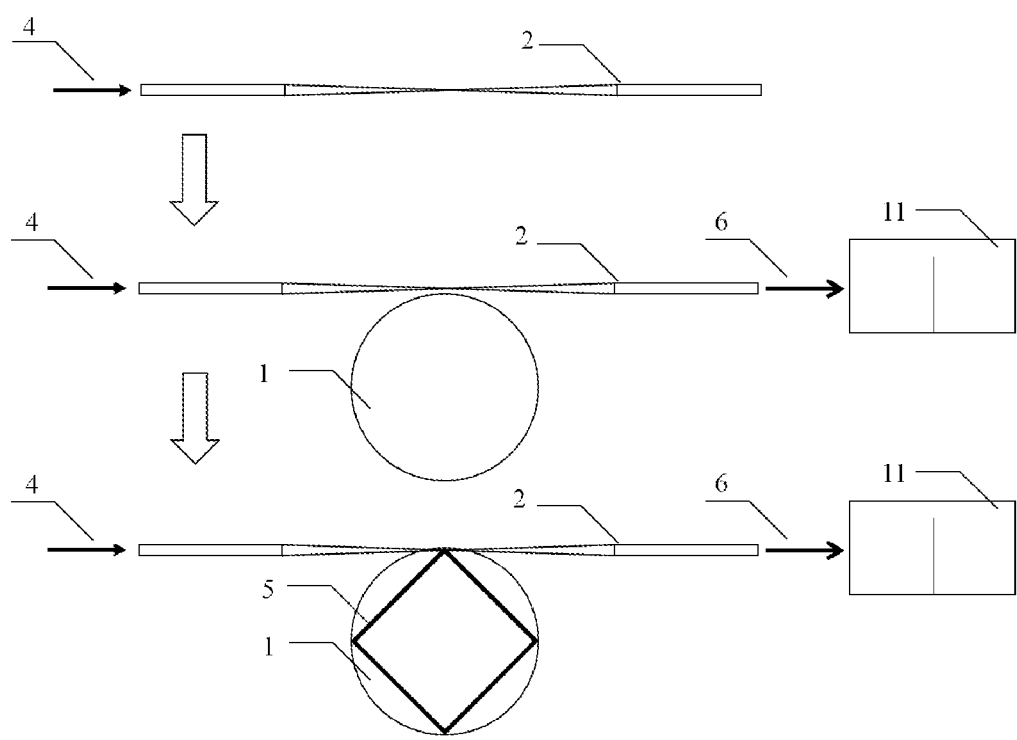
FIG. 4 is a flow chart for coupling an optical fiber cone and the ion-doped optical microcavity of the present invention.

1) Coupling an optical fiber cone to a lithium niobate film optical microcavity doped with erbium ions, wherein referring to FIG. 4, a wafer of a lithium niobate film 8 doped with 1 mol % erbium ions is illustrated; plating a 700 nm-thick chromium film as a mask, and etching the optical microcavity of a required size by a femtosecond laser; wherein the optical microcavity has a diameter of about 30 microns, and is located on a 2 μm-thick silicon dioxide layer pillar 9 supported by a underlying lithium niobate substrate 10; a free spectral range of the optical microcavity near a wavelength of 1550 nm is about 13 nm, which is about half of an erbium ion gain bandwidth (1535~1560 nm); processing the optical microcavity etched by the femtosecond laser with a chemical mechanical polishing technology (R. Wu, et al., Opt. Lett., Vol. 43, P 4116-4118, 2018) to obtain a whispering gallery mode optical microcavity 1 which has a smooth edge and is doped with the erbium ions, then performing auxiliary polishing with a polishing liquid containing 60 nm silica beads, wherein after polishing, a golden velvet polishing pad is used for carefully cleaning, so as to prevent small particles from scratching the optical microcavity, and an ultrasonic method can be used for deep cleaning; cleaning the polished optical microcavity by ultrasonic and cotton swab scrubbing methods to remove organic matters and particles on the surface, making a surface of the optical microcavity cleaner and reducing loss. A structure of the optical microcavity (specifically a micro-disk cavity) is shown in FIG. 3, wherein part (a) is a cross-sectional view, and part (b) is a top view of the part (a).

2) preparing an optical fiber cone with a size that can excite a fundamental spatial mode and a high-order spatial mode of the optical microcavity 2; wherein a heat stretching method for preparing the optical fiber cone 2 comprises steps of: first stripping a polymer layer of a standard single-mode optical fiber; cleaning the optical fiber and heating with hydrogen-oxygen flame, meanwhile stretching both ends of the optical fiber with a translation stage, so that a heated portion of the optical fiber is thinned; controlling a stretching time to obtain the required optical fiber cone. A diameter of the optical fiber cone to be used is about 2 microns.

3) after the optical microcavity 1 and the optical fiber cone 2 are prepared, performing a coupling test on the optical microcavity 1 and the optical fiber cone 2; adjusting a pump power of a pump light and coupling the pump light, whose pump power is greater than a pump threshold, into one end of the optical fiber cone; wherein the pump threshold is determined by the Q factor and mode volume of the microcavities and the gain coefficient of the gain material, which comprises specific steps of: attaching the waist of the optical fiber cone to an edge of the optical microcavity, and inputting the pump light into one end of the optical fiber cone; restricting a wavelength of the pump light within an absorption spectrum wide range of the gain material;

4) continuously scanning the wavelength of the pump light within the absorption spectrum wide range of the gain material and adjusting or controlling a lateral coupling position of the optical fiber cone and the optical microcavity; observing the optical microcavity in real time through charge coupled device microscopic imaging until a coherently combined mode with a polygonal configuration (quadrilateral) appears at pump wavelength, wherein the coherently combined mode is formed by superposition of a fundamental spatial mode and high-order spatial modes; then obtaining a Q value of the optical microcavity when the polygonal configuration appears through a transmission spectrum with weak pump power, where the Q factor of the fundamental spatial mode of the optical microcavity is at least 2 times lower than the Q value of the polygonal mode.

5) fixing the wavelength of the pump light and adjusting the pump power of the pump light 4 until the optical microcavity 1 displays a coherently combined mode 5 with a polygonal configuration within an absorption range of the gain material, wherein the coherently combined mode is formed by superposition of a fundamental spatial mode and high-order spatial modes, and is identical to the polygonal configuration in the step 4, wherein at this time, the pump light resonates with the coherently combined mode within the absorption spectrum of the gain material, and a lasing light resonates with a coherently combined mode within a fluorescence spectrum of the gain material.

6) coupling the lasing light 6 from an output end of the optical fiber cone 2, and testing a spectrum and a line width of the lasing light 6 with a spectrum analyzer 11 until a lasing with a single-mode, a narrow line width, and a low-threshold is obtained.

7) fixing, integrating and packaging the optical fiber cone 2 and the optical microcavity 1 to assemble a portable single-mode micro-laser 7 with a narrow line width (less than 10000 Hz) and a low threshold (80 microwatts).

Embodiment 2

Figure 5:
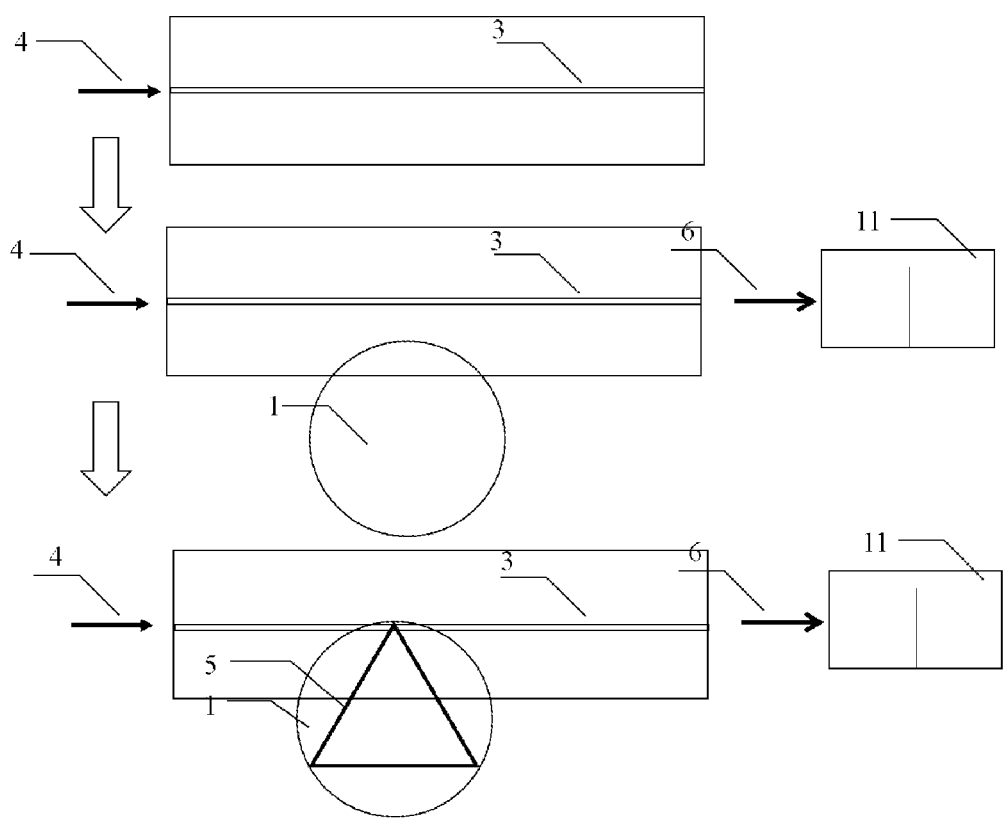
FIG. 5 is a flow chart for coupling an optical waveguide and an optical microcavity containing quantum dots of the present invention.

Referring to FIG. 5, coupling of an optical waveguide and an optical microcavity containing quantum dots is illustrated.

1) Etching the optical microcavity containing the quantum dots of a required size by a femtosecond laser; wherein after etching a free spectral range of the optical microcavity is at least ½ of a spectral width of a material containing the quantum dots; processing the optical microcavity with a chemical mechanical polishing technology (R. Wu, et al., Opt. Lett., Vol. 43, P 4116-4118, 2018) to obtain an optical microcavity with a smooth edge, wherein before polishing, a golden velvet polishing pad is used for carefully cleaning, so as to prevent small particles from scratching the optical microcavity, and an ultrasonic method can be used for deep cleaning; cleaning the polished optical microcavity by ultrasonic and cotton swab scrubbing methods to remove organic matters and particles on the surface, making a surface of the optical microcavity cleaner and reducing loss.

2) preparing a required optical waveguide by photolithography assisted dry etching and the chemo mechanical polishing technology to simultaneously accommodate high-order mode transmission and excite high-order modes of the optical microcavity within an absorption spectrum wide range and a gain spectrum wide range of the gain material; wherein a chemical mechanical polishing method can make two sides of the optical waveguide smoother (observable under a microscope) and reduce loss; cleaning the polishing pad before polishing to prevent particles from scratching the optical waveguide, and cleaning the polished optical waveguide for subsequent use. 3) performing a coupling test on the optical microcavity and the optical waveguide, and coupling a pump light, whose pump power is greater than a pump threshold, into the optical waveguide; wherein the pump threshold is determined by the Q factor and mode volume of the microcavities and the gain coefficient of the gain material, which comprises specific steps of: attaching the optical waveguide to an edge of the optical microcavity, and inputting the pump light into one end of the optical waveguide; restricting a wavelength of the pump light within the absorption spectrum wide range of the gain material.

4) coupling the pump light within the absorption spectrum wide range of the gain material to the optical waveguide, so as to be coupled with the microcavity; and adjusting or controlling a spatial position of the optical waveguide and the optical microcavity to excite fundamental and high-order spatial modes within the microcavities; continuously scanning the wavelength of the pump light; observing the optical microcavity in real time through charge coupled device microscopic imaging until a coherently combined mode with a polygonal configuration (triangular) appears at pump wavelength, wherein the coherently combined mode is formed by superposition of a fundamental spatial mode and high-order spatial modes; then obtaining a Q value of the optical microcavity when the polygonal configuration appears through a transmission spectrum with weak pump power; and the Q factor of the fundamental spatial mode is at least 2 times lower than the Q factor of the coherently combined mode.

5) fixing the wavelength of the pump light 4 and continuously adjusting the pump power of the pump light within the gain spectrum wide range of the gain material until the optical microcavity displays a coherently combined mode with a polygonal configuration within an absorption range of the gain material, wherein the coherently combined mode is formed by superposition of a fundamental spatial mode and a high-order spatial mode, and is identical to the polygonal configuration in the step 4, wherein at this time, the pump light resonates with the coherently combined mode within the absorption spectrum of the gain material, and a lasing light resonates with a coherently combined mode within a fluorescence spectrum of the gain material.

6) coupling the lasing light 6 from an output end of the optical waveguide 3, and testing a spectrum and a line width of the lasing light 6 with a spectrum analyzer 11 until a lasing with a single-mode, a narrow line width, and a low-threshold is obtained.

7) fixing, integrating and packaging the optical waveguide 3 and the optical microcavity 1 to assemble a portable single-mode micro-laser 7 with a narrow line width (less than 10000 Hz) and a low threshold (80 microwatts).

What is claimed is:

1. A preparation method of a single-mode micro-laser based on a single whispering gallery mode optical microcavity, comprising steps of:

1: preparing an optical microcavity containing a gain material by dry etching, wherein the optical microcavity is the whispering gallery mode optical microcavity; a free spectral range of the optical microcavity is at least ½ of a spectral width of the gain material; the gain material is rare earth ions, quantum dots, or organic macromolecular luminescent materials; a cavity material of the optical microcavity is crystals, silicon dioxides, silicon, III-V compound semiconductor materials or silicon nitride films;

2: preparing an optical fiber cone:

stripping a polymer layer of a standard single-mode optical fiber; cleaning the optical fiber and heating with hydrogen-oxygen flame, meanwhile stretching both ends of the optical fiber with a translation stage, so that a heated portion of the optical fiber is thinned to obtain the optical fiber cone, and a thinned position is called a waist;

3: performing a coupling test on the optical microcavity and the optical fiber cone, and coupling a pump light, whose pump power is greater than a pump threshold, into the optical fiber cone; wherein the pump threshold is determined by a Q factor and a mode volume of the optical microcavity and a gain coefficient of the gain material, which comprises specific steps of: attaching the waist of the optical fiber cone to an edge of the optical microcavity, and inputting the pump light into one end of the optical fiber cone; restricting a wavelength of the pump light within an absorption spectrum wide range of the gain material;

4: continuously scanning the wavelength of the pump light within the absorption spectrum wide range of the gain material and adjusting or controlling a lateral coupling position of the optical fiber cone and the optical microcavity; observing the optical microcavity in real time through charge coupled device microscopic imaging until a coherently combined mode with a polygonal configuration appears at a pump wavelength, wherein the coherently combined mode is formed by superposition of a fundamental spatial mode and high-order spatial modes; then obtaining the Q factor of the optical microcavity when the polygonal configuration appears through a transmission spectrum; wherein the Q factor of the fundamental spatial mode of the optical microcavity is at least 2 times lower than the Q factor of a polygonal mode;

5: fixing the wavelength of the pump light and continuously adjusting the pump power of the pump light until the optical microcavity displays a coherently combined mode with a polygonal configuration within an absorption range of the gain material, wherein the coherently combined mode is formed by superposition of a fundamental spatial mode and high-order spatial modes, and is identical to the polygonal configuration in the step 4, wherein at this time, the pump light resonates with the coherently combined mode within the absorption spectrum of the gain material, and a lasing light resonates with a coherently combined mode within a fluorescence spectrum of the gain material;

6: coupling the lasing light from an output end of the optical fiber cone, and testing a spectrum and a line width of the lasing light with a spectrum analyzer until a lasing with a single-mode is obtained; and 7: fixing, integrating and packaging the optical fiber cone and the optical microcavity to obtain the single-mode micro-laser based on the single whispering gallery mode optical microcavity.

2. A preparation method of a single-mode micro-laser based on a single whispering gallery mode optical microcavity, comprising steps of:

1: preparing an optical microcavity containing a gain material by dry etching, wherein the optical microcavity is the whispering gallery mode optical microcavity; a free spectral range of the optical microcavity is at least ½ of a spectral width of the gain material; the gain material is rare earth ions, quantum dots, or organic macromolecular luminescent materials; a cavity material of the optical microcavity is crystals, silicon dioxides, silicon, III-V compound semiconductor materials or silicon nitride films;

2: preparing an optical waveguide by photolithography assisted dry etching to simultaneously accommodate high-order mode transmission and excite a high-order mode of the optical microcavity within an absorption spectrum wide range and a gain spectrum wide range of the gain material;

3: performing a coupling test on the optical microcavity and the optical waveguide, and coupling a pump light, whose pump power is greater than a pump threshold, into the optical waveguide; wherein the pump threshold is determined by a Q factor and a mode volume of the optical microcavity and a gain coefficient of the gain material, which comprises specific steps of: attaching the optical waveguide to an edge of the optical microcavity, and inputting the pump light into one end of the optical waveguide; restricting a wavelength of the pump light within the absorption spectrum wide range of the gain material;

4: continuously scanning the wavelength of the pump light within the absorption spectrum wide range of the gain material, and adjusting or controlling a spatial position of the optical waveguide and the optical microcavity to excite fundamental and high-order spatial modes within the optical microcavity; observing the optical microcavity in real time through charge coupled device microscopic imaging until a coherently combined mode with a polygonal configuration appears at a pump wavelength, wherein the coherently combined mode is formed by superposition of a fundamental spatial mode and high-order spatial modes; then obtaining the Q factor of the optical microcavity when the polygonal configuration appears through a transmission spectrum; and the Q factor of the fundamental spatial mode is at least 2 times lower than the Q factor of the coherently combined mode;

5: fixing the wavelength of the pump light and continuously adjusting the pump power of the pump light until the optical microcavity displays a coherently combined mode with a polygonal configuration within an absorption range of the gain material, wherein the coherently combined mode is formed by superposition of a fundamental spatial mode and a high-order spatial mode, and is identical to the polygonal configuration in the step 4, wherein at this time, the pump light resonates with the coherently combined mode within the absorption spectrum of the gain material, and a lasing light resonates with a coherently combined mode within a fluorescence spectrum of the gain material;

6: coupling the lasing light from an output end of the optical waveguide, and testing a spectrum and a line width of the lasing light with a spectrum analyzer until a lasing with a single-mode is obtained; and 7: fixing, integrating and packaging the optical waveguide and the optical microcavity to obtain the single-mode micro-laser based on the single whispering gallery mode optical microcavity.

3. The single-mode micro-laser based on the single whispering gallery mode optical microcavity prepared by the preparation method as recited in claim 1.

4. The single-mode micro-laser based on the single whispering gallery mode optical microcavity prepared by the preparation method as recited in claim 2.

5. The single-mode micro-laser, as recited in claim 3, comprising: the single whispering gallery mode optical microcavity containing an active material, and the optical fiber cone or the optical waveguide, wherein the active material is rare earth ions, quantum dots, or organic macromolecular luminescent materials; the cavity material of the optical microcavity is crystals, silicon dioxides, silicon, III-V compound semiconductor materials or silicon nitride films; a line width of the single-mode micro-laser is less than 1 megahertz, and a threshold is less than 1 milliwatt.

6. The single-mode micro-laser, as recited in claim 4, comprising: the single whispering gallery mode optical microcavity containing an active material, and the optical fiber cone or the optical waveguide, wherein the active material is rare earth ions, quantum dots, or organic macromolecular luminescent materials; the cavity material of the optical microcavity is crystals, silicon dioxides, silicon, III-V compound semiconductor materials or silicon nitride films; a line width of the single-mode micro-laser is less than 1 megahertz, and a threshold is less than 1 milliwatt.

\* \* \* \* \*